(12) United States Patent
Kwak et al.

(10) Patent No.: US 9,424,947 B2
(45) Date of Patent: Aug. 23, 2016

(54) NONVOLATILE MEMORY DEVICE AND METHOD OF PROGRAM VERIFYING THE SAME

(71) Applicants: Donghun Kwak, Hwaseong-Si (KR); Hyun-Wook Park, Hwaseong-Si (KR); Kitae Park, Seongnam-Si (KR)

(72) Inventors: Donghun Kwak, Hwaseong-Si (KR); Hyun-Wook Park, Hwaseong-Si (KR); Kitae Park, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/284,031

(22) Filed: May 21, 2014

(65) Prior Publication Data
US 2015/0036426 A1    Feb. 5, 2015

(30) Foreign Application Priority Data

Jul. 30, 2013  (KR) .......................... 10-2013-0090280

(51) Int. Cl.
*G11C 16/34*    (2006.01)
*G11C 16/10*    (2006.01)
*G11C 16/26*    (2006.01)
*G11C 16/04*    (2006.01)

(52) U.S. Cl.
CPC ....... *G11C 16/3459* (2013.01); *G11C 16/0483* (2013.01); *G11C 16/10* (2013.01); *G11C 16/26* (2013.01)

(58) Field of Classification Search
CPC ... G11C 16/3459; G11C 16/10; G11C 16/26; G11C 16/0483
See application file for complete search history.

(56) References Cited

U.S. PATENT DOCUMENTS

| 6,580,643 | B1 * | 6/2003 | Satoh ...................... | G11C 16/14 365/185.22 |
| 7,764,542 | B2 | 7/2010 | Edahiro et al. | |
| 7,907,452 | B2 * | 3/2011 | Park ....................... | G11C 16/10 365/185.03 |
| 8,213,233 | B2 * | 7/2012 | Sarin ................... | G11C 11/5628 365/185.17 |
| 2004/0130942 | A1 * | 7/2004 | Yeh ..................... | G11C 16/3404 365/185.01 |
| 2007/0036001 | A1 | 2/2007 | Kanda et al. | |
| 2007/0183208 | A1 * | 8/2007 | Tanaka ............... | G11C 16/3427 365/185.22 |
| 2010/0008146 | A1 | 1/2010 | Son et al. | |
| 2010/0118606 | A1 | 5/2010 | Lee et al. | |
| 2011/0051520 | A1 * | 3/2011 | Kim .................... | G11C 11/5628 365/185.19 |

(Continued)

FOREIGN PATENT DOCUMENTS

| KR | 10-2010-006712 A | 1/2010 |
| KR | 10-2010-0053215 A | 5/2010 |
| KR | 10-2012-0079326 A | 7/2012 |

OTHER PUBLICATIONS

Jong Kyung Park et al., "Origin of transient Vth shift after erase and its impact on 2D/3D structure charge trap Flash memory cell operations" 2012 IEEE.

*Primary Examiner* — Vanthu Nguyen
(74) *Attorney, Agent, or Firm* — Volentine & Whitt, PLLC

(57) ABSTRACT

A program method of a three-dimensional nonvolatile memory device is provided which includes executing at least one program loop including an operation of programming selected memory cells of a selected string turned on by a selected string selection transistor and an operation of verifying whether programming of the memory cells is passed; and applying a negative counter voltage to a selected word line connected to the selected memory cells of the selected string at least once during an interval of the verify operation where there are turned on string selection transistors of unselected strings connected through the same bit line as that of the selected string.

5 Claims, 14 Drawing Sheets

(56) References Cited

U.S. PATENT DOCUMENTS

2012/0044771 A1* 2/2012 Joo .................... G11C 16/0483
365/185.22

2012/0081962 A1* 4/2012 Tsai .................... G11C 16/0483
365/185.15

2012/0170374 A1 7/2012 Im et al.

* cited by examiner

NONVOLATILE MEMORY DEVICE AND METHOD OF PROGRAM VERIFYING THE SAME

CROSS-REFERENCE TO RELATED APPLICATIONS

A claim for priority under 35 U.S.C. §119 is made to Korean Patent Application No. 10-2013-0090280 filed Jul. 30, 2013, in the Korean Intellectual Property Office, the entire contents of which are hereby incorporated by reference.

BACKGROUND

Embodiments of the inventive concept described herein relate to semiconductor memory devices, and more particularly, program verifying methods of nonvolatile semiconductor memory devices.

Semiconductor memories include volatile memories, such as dynamic random access memory (RAM) (DRAM), static RAM (SRAM), and the like, and nonvolatile memories, such as electrically erasable programmable read-only memory (EEPROM), ferroelectric RAM (FRAM), phase-change RAM (PRAM), magnetic RAM (MRAM), resistive random-access memory (ReRAM), flash memory, and the like. The volatile memories lose data stored therein at power-off, while the nonvolatile memories retain data stored therein even at power-off. The flash memory in particular has merits such as a high read speed, low power consumption, storage of a large amount of data, and the like. Thus, data storage devices including flash memory are widely used as storage mediums.

As nonvolatile memory, a floating gate type flash memory stores bit information by injecting charges in a floating gate formed of polysilicon. In the flash memory, a memory cell may be used as a single level cell (SLC) storing one of two states "1" and "0", or as a multi-level cell (MLC) storing one of four states "11", "01", "10" and "00".

A Charge Trap Flash (CTF) memory is used to solve problems due to capacitive coupling between conductive floating gates, and uses a memory layer (i.e., a charge storage layer) instead of a conventional conductive floating gate. Threshold voltage distributions of programmed memory cells in a CRF memory are rearranged in charge storage layers during a program verify operation for verifying programming of memory cells. This may mean that threshold voltage distributions are varied. Thus, it is difficult to perform a program verify operation exactly using a conventional method where a read voltage is decided by setting constant margins at left and right sides of a threshold voltage distribution of multi-level cells. As a result, errors may occur.

SUMMARY

According to an embodiment of the inventive concept, a method is provided for programming a three-dimensional nonvolatile memory device. The method includes executing at least one program loop including a programming step for programming selected memory cells of a selected string turned on by a selected string selection transistor and a verifying step for verifying whether the programming of the selected memory cells has passed; and applying a negative counter voltage to a selected word line connected to the selected memory cell at least once during an interval of the verifying step. The string selection transistors of unselected strings, connected through the same bit line as that of the selected string, are turned on.

A level of the negative counter voltage may be varied according to a multi-level program state. Also, duration of the negative counter voltage may be varied according to a multi-level program state.

The negative counter voltage may be applied after execution of a number of program loops that exceeds a predetermined reference number. The predetermined reference number may be an integer more than 2 and less than a total number of verifying steps. The predetermined reference number may be half a total number of verifying steps.

A voltage level of the negative counter voltage may be variable according to program loops. Also, the duration of the negative counter voltage is variable according to program loops.

The negative counter voltage may be changed after a particular program stage is passed. The negative counter voltage may be applied at a program loop just before a particular program state is passed. A time of applying the negative counter voltage may be variable according to endurance cycles.

A level of the negative counter voltage may be varied in accordance with endurance cycles. Also, a duration of the negative counter voltage may be varied in accordance with endurance cycles.

According to another embodiment of the inventive concept, a nonvolatile memory device includes a memory cell array, a row selection circuit, a page buffer circuit and a voltage generator. The memory cell array has memory cells arranged at intersections of word lines and bit lines and stacked in a direction perpendicular to a substrate. The row selection circuit is configured to drive selected word lines selected from among the word lines. The page buffer circuit includes a plurality of page buffers corresponding to the bit lines, the page buffer circuit being configured to temporarily store data to be programmed in the memory cell array or data read out from the memory cell array. The voltage generator is configured to generate a verification voltage during a verify operation, the verification voltage being used to verify whether programming of a selected memory cell of a selected string turned on by a selected string selection transistor is passed, and to generate a negative counter voltage applied to a selected word line connected to the selected memory cell at least once during an interval of the verify operation. There are turned on string selection transistors of unselected strings connected through the same bit line as that of the selected string.

The nonvolatile memory device may further include control logic configured to control generation of the negative counter voltage. Also, the voltage generator may be further configured to generate a program voltage during a program operation preceding the verify operation, the program voltage being used to program the selected memory cell of the selected string.

According to another embodiment of the inventive concept, a nonvolatile memory device includes a memory cell array, control logic and a voltage generator. The memory cell array includes a plurality of memory cells arranged at intersections of word lines and bit lines and stacked in a direction perpendicular to a substrate. The control logic is configured to control at least a program operation comprising a plurality of program loops for programming a selected memory cell of the plurality of memory cells in the memory cell array, each program loop including a programming step and a verifying step. The voltage generator is configured to generate a program voltage, higher than a power supply voltage, applied to a selected word line connected to the selected memory cell during the programming step of each program loop, to generate a pass voltage, higher than the power supply voltage, applied to the selected word line and unselected word lines during the programming step of each program loop, and to generate a negative counter voltage applied to the selected word line during the verifying step of at least one program loop.

The negative counter voltage may be applied only during an initial stage of the verifying step of a final program loop. The negative counter voltage may be applied only after the verifying step of a final program loop. Or, the negative counter voltage may be applied during an initial stage of the verifying step of fewer than all of the of program loops.

BRIEF DESCRIPTION OF THE FIGURES

Illustrative embodiments of the inventive concept will be more clearly understood from the following description with reference to the following figures, where like reference numerals refer to like parts throughout unless otherwise specified, and in which.

DETAILED DESCRIPTION

Figure 1:
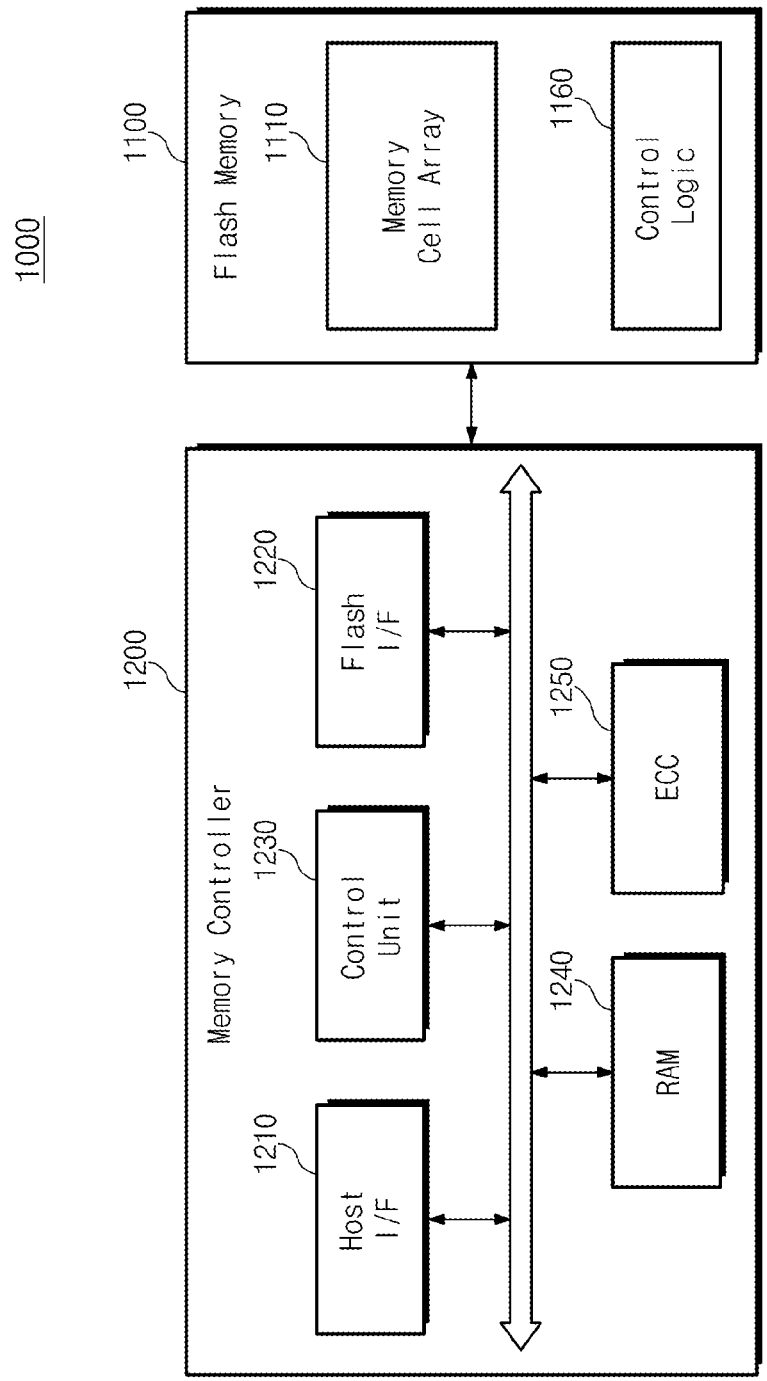
FIG. 1 is a block diagram schematically illustrating a data storage device, according to an embodiment of the inventive concept.

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description, and thus descriptions may be repeated. In the drawings, sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a data storage device, according to an embodiment of the inventive concept. Referring to FIG. 1, a data storage device 1000 includes a flash memory 1100 and a memory controller 1200. The flash memory system 1000 may include flash memory based data storage devices, such as a memory card, a universal serial bus (USB) memory, a solid state drive (SSD), and the like.

Referring to FIG. 1, the flash memory 1100 includes a memory cell array 1110 and control logic 1160. The memory cell array 1110 includes a plurality of memory blocks, each of which has a three-dimensional structure (or, a vertical structure) formed in a direction perpendicular to a substrate. The control logic 1160 controls program (write), verify, read and erase operations of the flash memory 1100 using command, address, and control signals.

The memory controller 1200 includes a host interface (I/F) 1210, a flash interface (I/F) 1220, a control unit 1230, random access memory (RAM) 1240, and an error correction code (ECC) circuit 1250. The memory controller 1200 controls the program, read and erase operations of the flash memory 1100 in response to requests from an external device, such as a host (not shown). The memory controller 1200 exchanges data with the host through the host interface 1210 and exchanges data with the flash memory 1100 through the flash interface 1220. The host interface 1210 may be connected to the host according to various standards, such as an advanced technology attachment (ATA) bus, a parallel ATA (PATA) bus, a serial ATA (SATA) bus, a small computer system interface (SCSI), a USB, a PCI express (PCIe) interface, and the like.

The control unit 1230 controls overall operations of the flash memory 1100, including writing, reading, file system managing, bad page managing, and the like. For example, although not shown in FIG. 1, the control unit 1230 may include a central processing unit (CPU), a processor, an SRAM, and a DMA controller, for example.

The RAM 1240 operates under control of the control logic 1230, and may be used as a working memory, a buffer memory, a cache memory, and the like. When the RAM 1240 is used as the working memory, data processed by the control unit 1230 is temporarily stored in the RAM 1240. When used as the buffer memory, the RAM 1240 is used to buffer data to be transferred from the flash memory 1100 to the host or from the host to the flash memory 1100. When used as the cache memory, the RAM 1240 enables a low-speed flash memory 1100 to operate in high speed.

The ECC circuit 1250 generates an error correction code ECC for correcting fail bits or error bits of data received from the flash memory 1100. The ECC circuit 1250 performs error correction by encoding on data provided to the flash memory 1100, such that parity bit information is added to the data. The parity bit information may be stored in the flash memory 1100. The ECC circuit 1250 performs error correction by decoding on data output from the flash memory 1100. For example, the ECC circuit 1250 corrects errors using the parity bit information. The ECC circuit 1250 may correct an error using low density parity check (LDPC) code, Bose-Chaudhuri-Hocquenghem (BCH) code, turbo code, Reed-Solomon code, convolution code, recursive systematic code (RSC), and coded modulation, such as trellis-coded modulation (TCM), and/or block coded modulation (BCM), for example.

The ECC circuit 1250 has an allowable error correction capacity. For example, the ECC circuit 1250 may correct a 40-bit error at maximum with respect to page data of 2 KB. In this case, an allowable maximum error correction capacity of the ECC circuit 1250 is 40 bits. That is, when more than 40 error bits are generated, the ECC circuit 1250 does not correct the error bits, the corresponding page is deemed to be uncorrectable. Such an uncorrectable page may be referred to as a defected page. An erroneous memory cell in the defected page is referred to as a defected cell.

Figure 2:
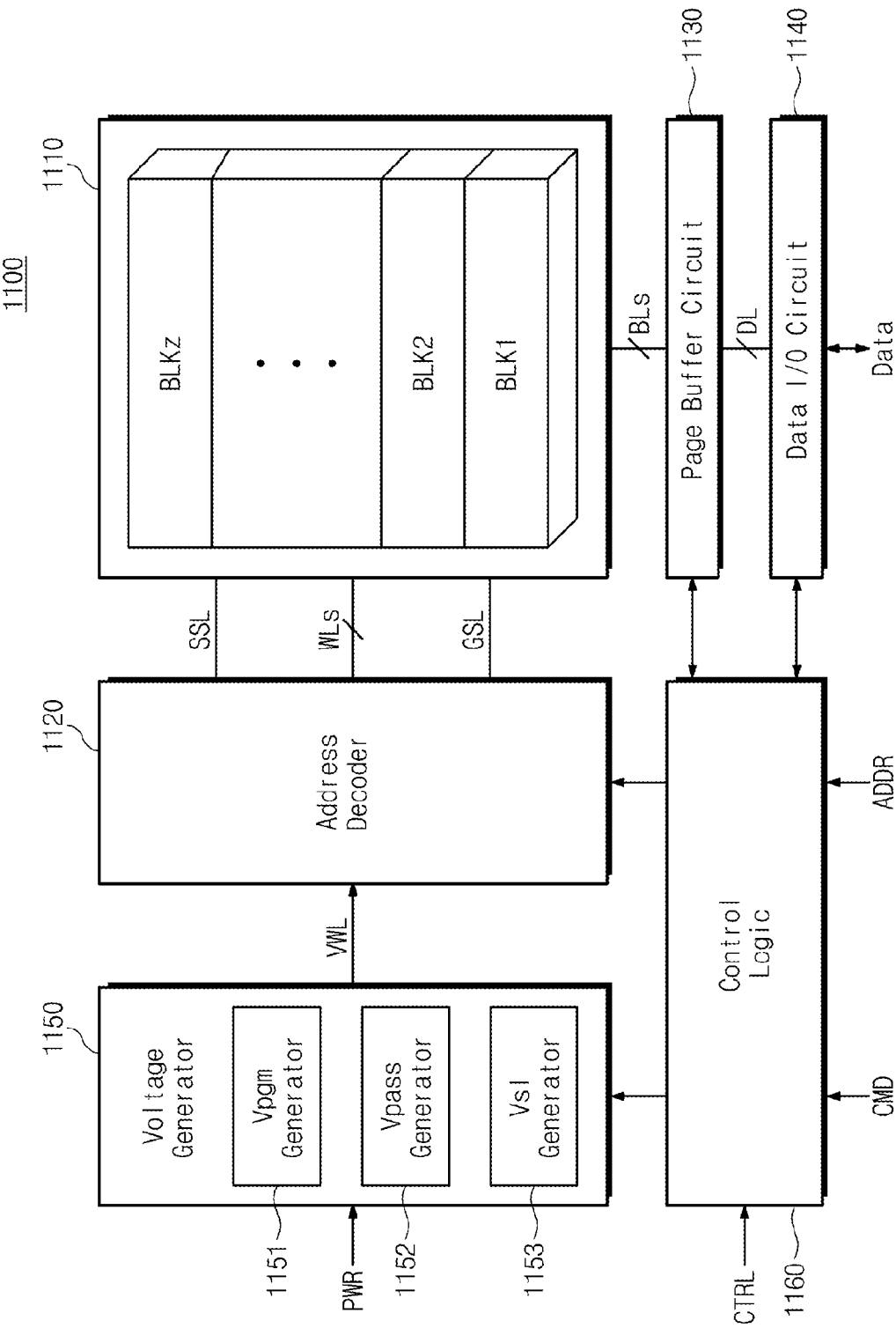
FIG. 2 is a block diagram schematically illustrating a flash memory shown in FIG. 1, according to an embodiment of the inventive concept.

FIG. 2 is a block diagram schematically illustrating a flash memory shown in FIG. 1, according to an embodiment of the inventive concept. Referring to FIG. 2, the flash memory 1100 includes a memory cell array 1110, an address decoder 1120, a page buffer circuit 1130, a data input/output circuit 1140, a voltage generator 1150, and control logic 1160.

The memory cell array 1110 may be formed of a plurality of memory blocks BLK1 to BLKz, each of which has a three-dimensional structure (or, a vertical structure). In a memory block having a two-dimensional structure (or, a horizontal structure), memory cells are formed in a direction parallel with a substrate. However, in a memory block having a three-dimensional structure (or, a vertical structure), memory cells are formed in a direction perpendicular to the substrate.

The address decoder 1120 is connected to the memory cell array 1110 via selection lines SSL and GSL and word lines WLs. The address decoder 1120 receives a word line voltage VWL from the voltage generator 1150 and is controlled by the control logic 1160. The address decoder 1120 selects a word line during a program or read operation. A program voltage or a read voltage is applied to the selected word line, depending on the operation.

The page buffer circuit 1130 is connected to the memory cell array 1110 via bit lines BLs. The page buffer circuit 1130 includes a plurality of page buffers (not shown). One page buffer may be connected to a bit line, or two or more page buffers may be connected to a bit line. The page buffer circuit 1130 temporarily stores data to be programmed in a selected page or data read out from the selected page.

The data input/output circuit 1140 is connected to the page buffer circuit 1130 via data lines DL. Further, the data input/output (I/O) circuit 1140 is connected to a memory controller 1200 (shown in FIG. 1) via input/output lines. The data input/output circuit 1140 receives program data from the memory controller 1200 during program operations and provides read data to the memory controller 1200 during read operations.

The voltage generator 1150 receives power PWR from the memory controller 1200 to generate the word line voltage VWL needed to read, write and verify data. The word line voltage VWL is provided to the address decoder 1120. The voltage generator 1150 generates a high voltage higher than a power supply voltage. The high voltage is used as a program voltage or a pass voltage during program operations and as a read voltage during read operations. Also, the high voltage is used as an erase voltage during erase operations.

In the depicted embodiment, the voltage generator 1150 includes a Vpgm generator 1151, a Vpass generator 1152, and a Vsl generator 1153. The Vpgm generator 1151 generates a program voltage Vpgm provided to a selected word line during a program operation. When the program operation includes more than one program loop, the program voltage Vpgm increases during a programming step of each consecutive program loop, as discussed below. The Vpass generator 1152 generates a pass voltage Vpass provided to selected and unselected word lines during the program operation. The pass voltage Vpass is constant regardless of increases in the program loops. The Vsl generator 1153 generates a selection line voltage provided to the string selection line SSL or the ground selection line GSL. The voltage generator 1150 is also configured to generate voltage for verify operations following program operations. For example, in various embodiments, the voltage generator 1150 generates verification voltages (which may be the same as read voltages) used to verify whether programming of a selected memory cell is passed, and generates a negative counter voltage applied to the selected word line connected to the selected memory cell at least once during an interval of the verify operation.

The control logic 1160 controls programming, reading, and erasing of the flash memory 1100 in response to a command CMD, an address ADDR, and a control signal CTRL provided by the memory controller 1200. For example, during a program operation, the control logic 1160 controls the address decoder 1120 such that the program voltage Vpgm is supplied to a selected word line, and controls the page buffer circuit 1130 and the data input/output circuit 1140 such that program data is provided to a selected page.

Figure 3:
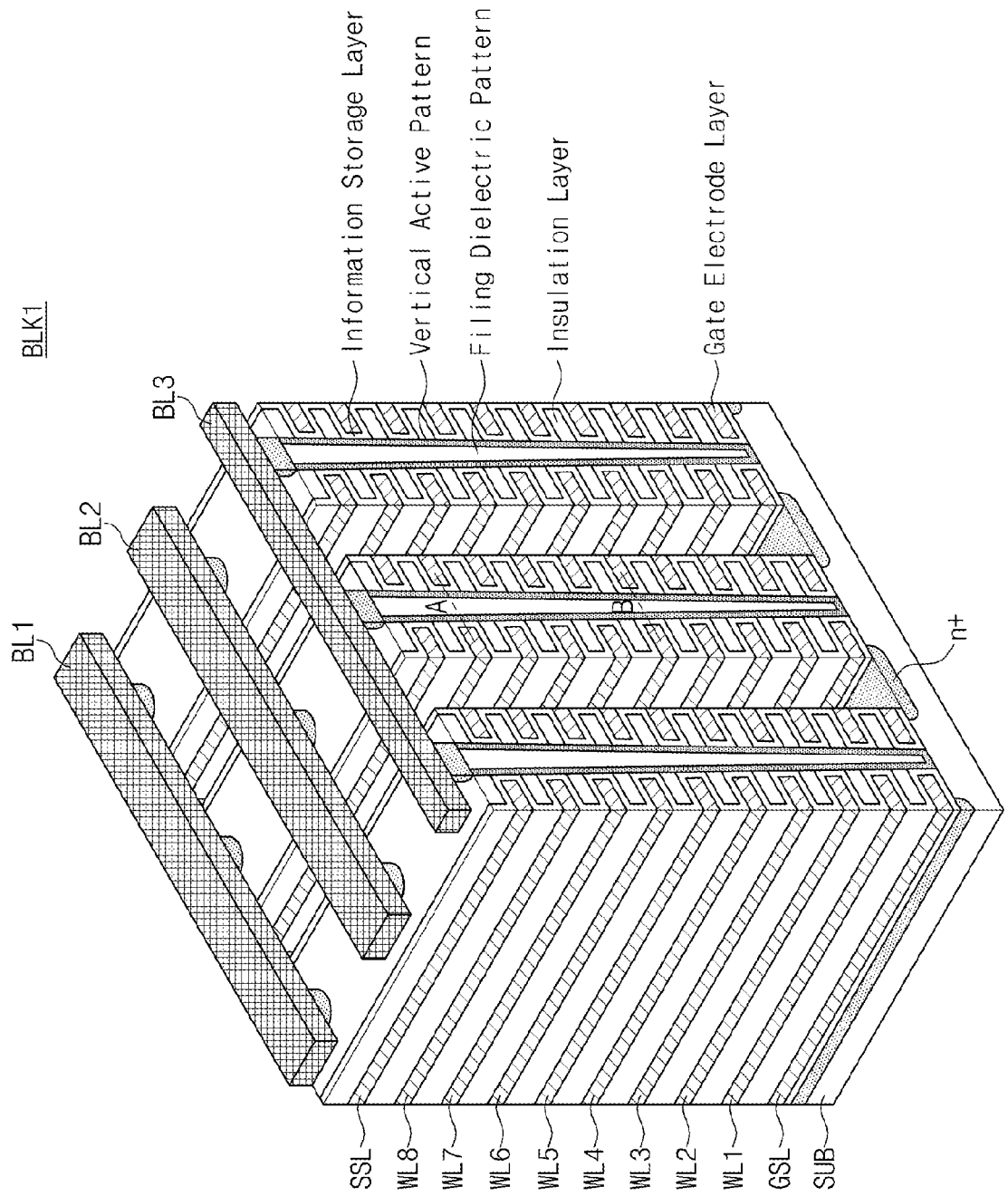
FIG. 3 is a perspective view schematically illustrating a three-dimensional structure of a memory block BLK1 shown in FIG. 2, according to an embodiment of the inventive concept.

FIG. 3 is a perspective view schematically illustrating a three-dimensional structure of representative memory block BLK1 shown in FIG. 2, according to an embodiment of the inventive concept. Referring to FIG. 3, a memory block BLK1 is formed in a direction perpendicular to a substrate SUB. An n+ doping region is formed in the substrate SUB.

Gate electrode layers and insulation layers are deposited alternately on the substrate SUB. Charge storage layers (or, information storage layers) are formed between the gate electrode layers and the insulation layers. When the gate electrode layers and the insulation layers are patterned in a vertical direction, a V-shaped pillar is formed. The pillar is connected to the substrate SUB via the gate electrode layer and the insulation layer. An outer portion O of the pillar may be formed of a channel semiconductor, such as a vertical active pattern, and an inner portion I of the pillar may be formed of an insulation material, such as silicon oxide, by a filling dielectric pattern.

The gate electrode layer of the memory block BLK1 is connected to a ground selection line GSL, a plurality of word lines WL1 to WL8, and a string selection line SSL. The pillars of the memory block BLK1 are connected to a plurality of bit lines (e.g., bit lines BL1 to BL3). In FIG. 3, the one memory block BLK1 is shown as having two selection lines SSL and GSL, eight word lines WL1 to WL8, and three bit lines BL1 to BL3. However, embodiments of the inventive concept are not limited to this configuration.

Figure 4:
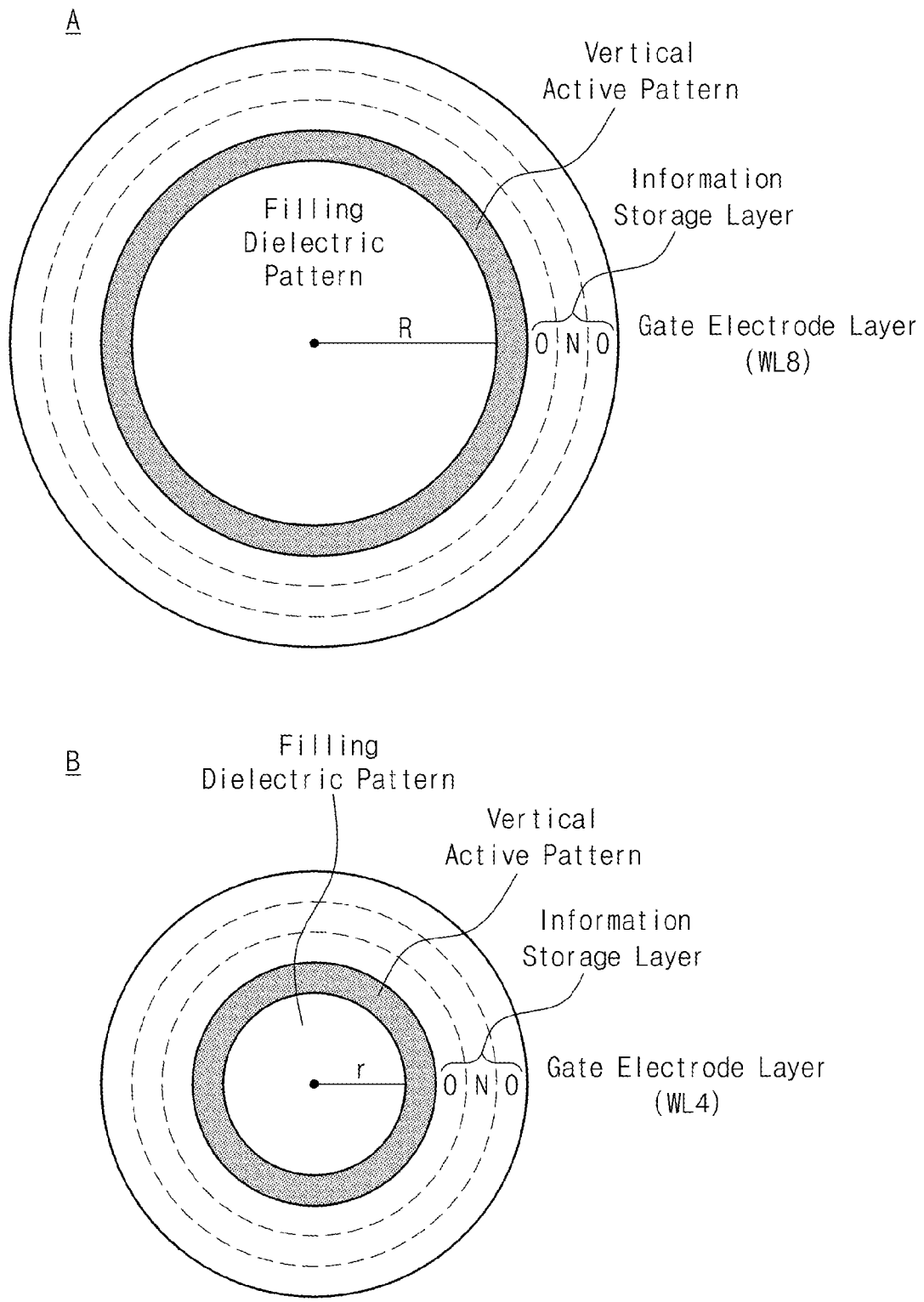
FIG. 4 shows top views of cross sections of a memory block BLK1 taken along dotted lines A and B shown in FIG. 3.

FIG. 4 shows top views of cross sections of the memory block BLK1 taken along dotted lines A and B shown in FIG. 3, according to an embodiment of the inventive concept. In FIG. 4, a cross section A is a plane corresponding to word line WL8, and a cross section B is a plane corresponding to word line WL4.

Referring to the cross sections A and B, a memory cell is formed of a filling dielectric pattern, a vertical active pattern, an information storage layer, and a gate electrode layer, which are sequentially formed outward from a core. The filling dielectric pattern may be formed of silicon oxide or an air gap, for example. The vertical active pattern may be formed of a p-type silicon layer, for example, and acts as a channel of the memory cell.

The information storage layer includes a tunnel insulation layer, a charge storage layer, and a blocking insulation layer. The tunnel insulation layer acts as an insulation layer that transfers charges through tunneling effect. The charge storage layer is formed of an insulation layer that traps charges. The charge storage layer, for example, may be formed of silicon nitride (SiN) or metal (e.g., aluminum or hafnium). The blocking insulation layer acts as an insulation film between the gate electrode layer and the charge storage layer. The blocking insulation layer may be formed of silicon oxide, for example. Here, the tunnel insulation layer, the charge storage layer, and the blocking insulation layer collectively constitute an insulation layer having an oxide-nitride-oxide (ONO) structure, as shown in FIG. 4.

Referring again to FIG. 3, a three-dimensional flash memory is formed by etching a multi-layer thin film at a time to form a hole, and by forming a silicon channel film in the hole. Diameters of the hole formed through the etching process vary according to depth. That is, the closer to the substrate, the smaller the diameter of the hole. Consistently, as illustrated in FIG. 4, radius R of a filling dielectric pattern corresponding to the word line WL8 is larger than radius r of a filling dielectric pattern corresponding to the word line WL4.

This phenomenon is based on etching depth, and causes different characteristics between the memory cells connected to different word lines, such as memory cells respectively connected to the word lines WL8 and WL4. In general, the larger the diameter of a pillar, the smaller the effective area of the gate electrode film. Decreases in the effective area means increases in resistance value, as well as increases in capacitance formed between layers. Therefore, as the diameter of the pillar becomes larger, coupling capacitance and resistance of the memory cells increase. For example, the word line WL8 placed at the uppermost layer of a pillar has maximum resistance and maximum capacitance.

Meanwhile, memory cells formed at the same layer may have similar cell characteristics. For example, since memory cells connected to the word line WL4 have the same diameter, their coupling capacitance and resistance are similar.

Figure 5:
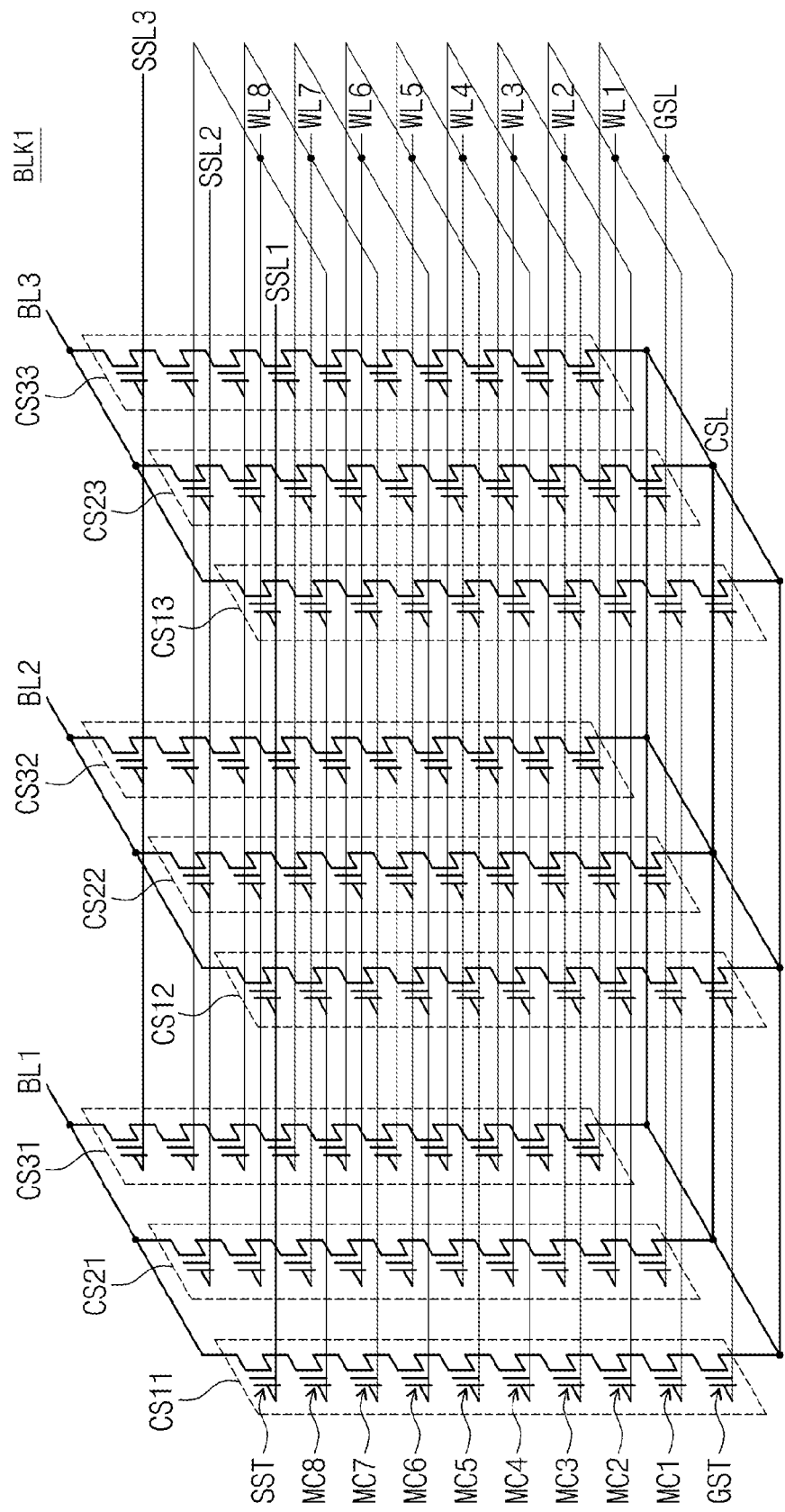
FIG. 5 is an equivalent circuit of a memory block illustrated in FIG. 3, according to an embodiment of the inventive concept.

FIG. 5 is an equivalent circuit diagram of a memory block illustrated in FIG. 3, according to an embodiment of the inventive concept. Referring to FIG. 5, cell strings CS11 to CS33 are connected between bit lines BL1 to BL3 and a common source line CSL. Each cell string (e.g., CS11)

includes a string selection transistor SST, a plurality of memory cells MC1 to MC8, and a ground selection transistor GST.

The string selection transistors SST is connected to a string selection line SSL. The string selection line SSL is divided into first to third string selection lines SSL1 to SSL3. The ground selection transistors GST is connected to a ground selection line GSL. The cell strings are connected in common to the ground selection line GSL. In each cell string, the string selection transistor SST is connected to a bit line, and the ground selection transistor GST is connected to the common source line CSL.

In each cell string, the memory cells MC1 to MC8 are connected to corresponding word lines WL1 to WL8, respectively. A group of memory cells connected to a word line and programmed at the same time is referred to a page. The memory block BLK1 is formed of a plurality of pages. Also, a plurality of pages is connected to a word line. For example, referring to FIG. 5, a word line (e.g., WL4) of the same level from the common source line CSL is connected in common to three pages.

Meanwhile, each memory cell stores 1-bit data or m-bit data (m being an integer of 2 or more). A memory cell storing one data bit is referred to as a single level cell or a single bit cell. A memory cell storing two or more data bits is referred to as a multi-level cell or a multi bit cell. In the case of a 2-bit MLC, two pages of data are stored at a physical page. Thus, six pages of data are stored in memory cells connected to the word line WL4.

Figure 6:
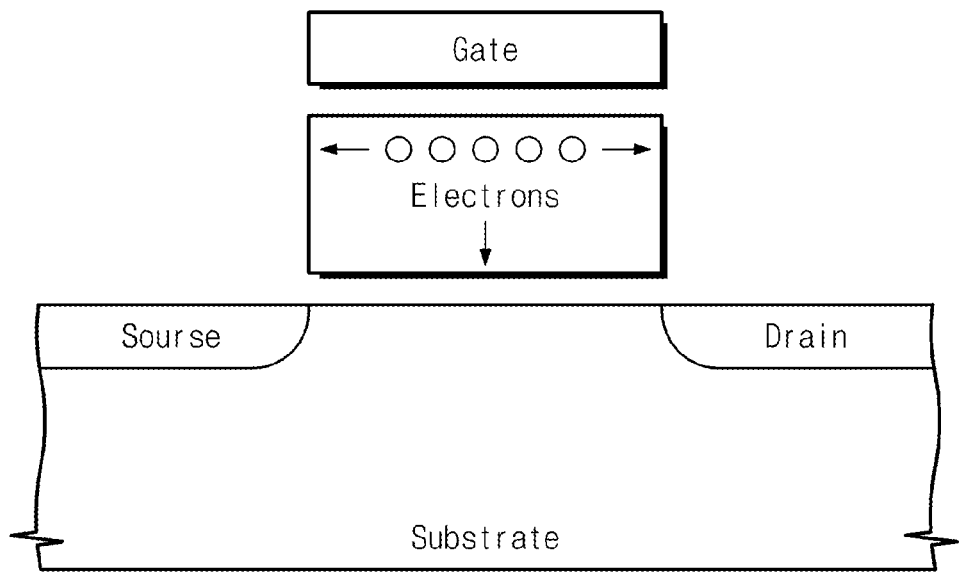
FIG. 6 is a diagram showing movement of electrons trapped in a memory layer after programming of a charge trap flash memory.

FIG. 6 is a diagram showing movement of electrons trapped in a memory layer after programming of a charge trap flash memory. In a multi-level cell, a narrow threshold voltage distribution of memory cells corresponding to each write state is required to distinguish write states independently. However, as a cell size of a flash memory using a floating gate is scaled down, it is difficult to control a threshold voltage distribution due to capacitive coupling existing between memory cells or between a memory cell and a selection transistor (e.g., SST or GST).

A charge trap flash memory refers to a flash memory that uses a memory layer (i.e., a charge storage layer), such as $Si_3N_4$, $Al_2O_3$, HfAlO, or HfSiO, for example, instead of a conductive floating gate to solve the capacitive coupling between conductive floating gates. In the charge trap flash memory, when a program/erase voltage for a program/erase operation is applied, energy levels of electrons in a memory layer are stabilized without electron injection/discharge into/from the memory layer. This phenomenon is referred to as "rearrangement". Due to the rearrangement phenomenon of the charge trap flash memory, a threshold voltage of a memory cell is stabilized after a period of time elapses from when the program or erase voltage is applied to the charge trap flash memory.

Figure 7:
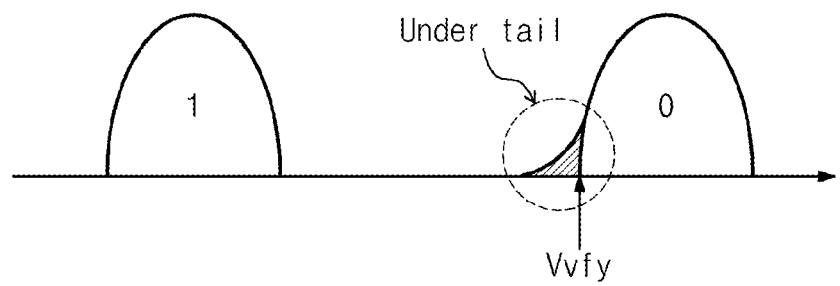
FIG. 7 is a diagram showing a threshold voltage distribution expected considering a charge rearrangement characteristic in a memory cell shown in FIG. 6.

FIG. 7 is a diagram showing a threshold voltage distributions expected considering a charge rearrangement characteristic in a memory cell shown in FIG. 6. Referring to FIGS. 6 and 7, when charges trapped in a memory layer shift downwards (vertical direction in FIG. 6) for stabilization, an under tail is formed at an initial distribution. When charges trapped in the memory layer shift in both directions (horizontal direction in FIG. 6) for stabilization, an upper tail (not shown) is formed at the initial distribution.

Figure 8:
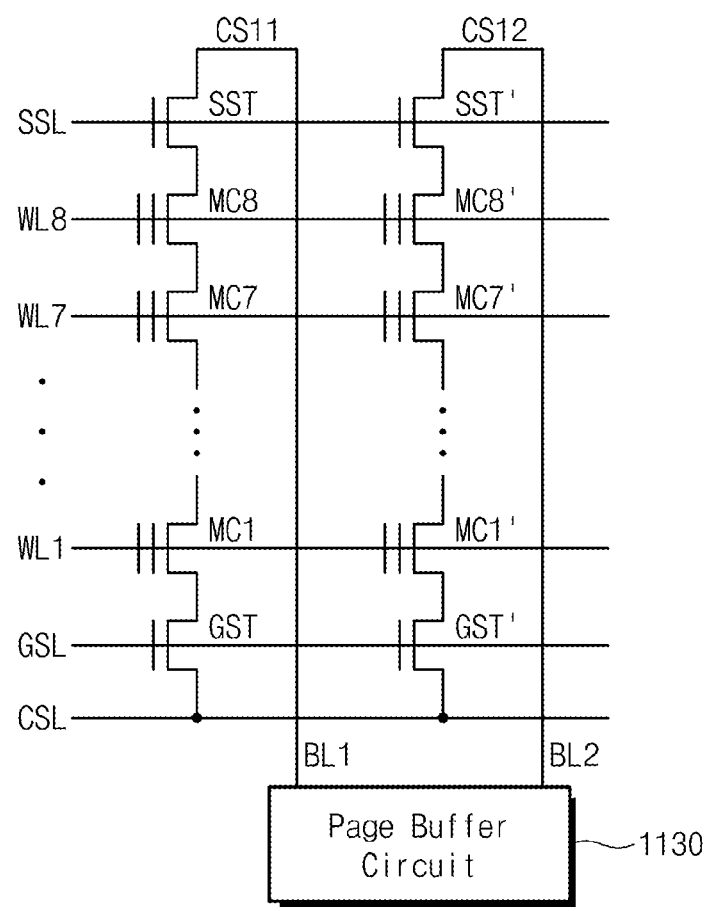
FIG. 8 is a diagram schematically illustrating cell strings CS11 and CS12 of a memory block shown in FIG. 5.

FIG. 8 is a circuit diagram schematically illustrating cell strings CS11 and CS12 of a memory block shown in FIG. 5. Cell strings CS11 and CS12 of the memory block BLK1 are configured substantially the same as shown in FIG. 5, and thus descriptions thereof are omitted.

Figure 9:
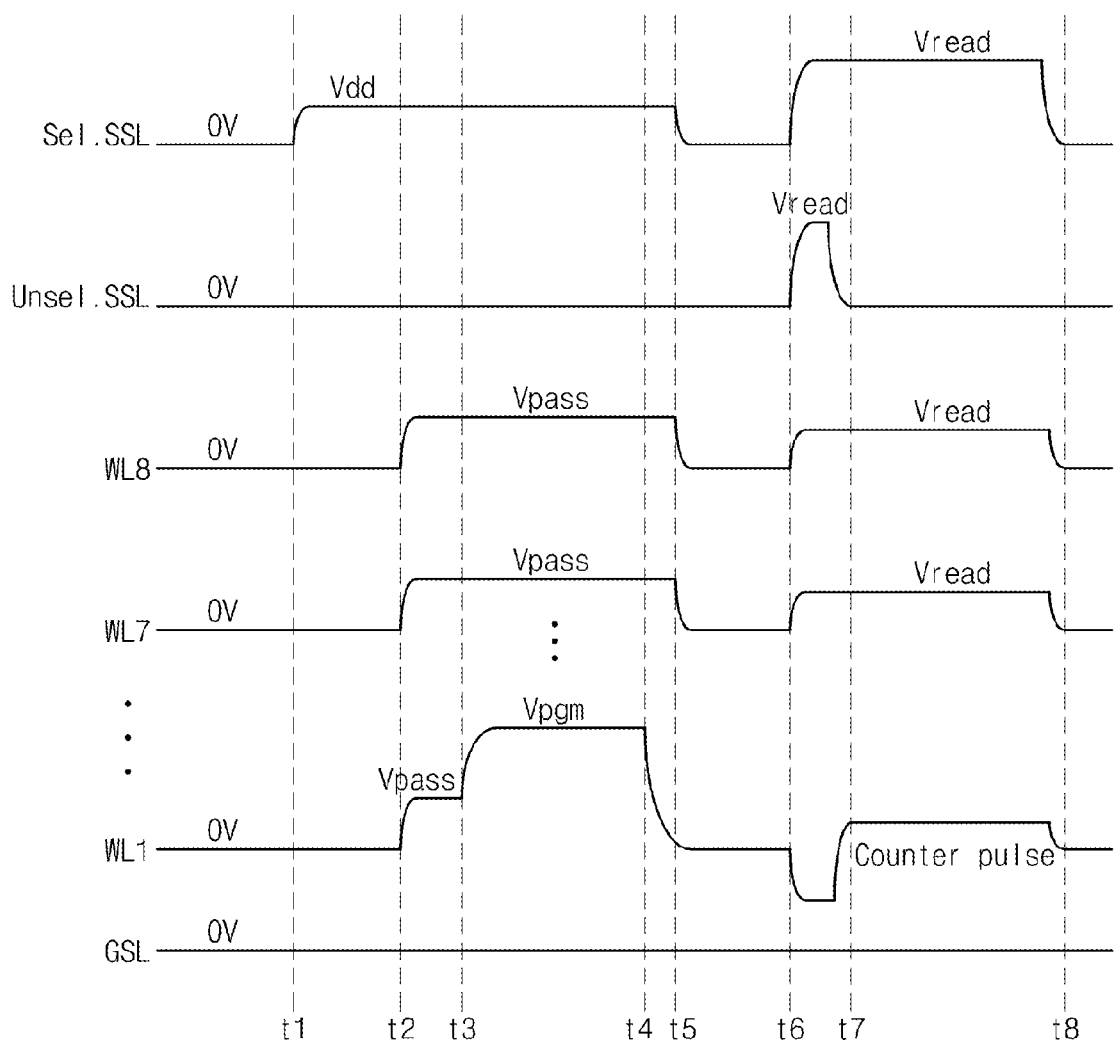
FIG. 9 is a timing diagram schematically illustrating a program operation of a flash memory device, according to an embodiment of the inventive concept.

FIG. 9 is a timing diagram schematically illustrating program and verify operations of a flash memory device, according to an embodiment of the inventive concept. FIG. 9 shows variations in voltages of a selected string selection line Sel. SSL, an unselected string selection line Unsel. SSL, unselected word lines WL2 to WL8, and a selected word line WL1. When a program operation commences, a bit line BL2 of a program cell MC1' is set up by 0V, and a bit line BL1 of a program inhibited cell MC1 is set up by a power supply voltage Vdd.

At t1, the power supply voltage Vdd is applied to selected string selection line Sel. SSL. Although ground voltage (e.g., 0V) is applied to unselected string selection line Unsel. SSL during the program operation in FIG. 9, pre-pulse (e.g., short positive voltage) may be applied to unselected string selection line Unsel. SSL to prevent program disturbance during an initial stage of the program operation (e.g., during the initial stage of the interval between t1 and t2). For example, the power supply voltage Vdd may be applied by Vsl generator 1153 illustrated in FIG. 2.

At t2, a pass voltage Vpass (e.g., about 8V) is applied to the selected word line WL1 and the unselected word lines WL2 to WL8. At this time, capacitance coupling arises between a gate of the program inhibited cell MC1 and a channel. A channel voltage is boosted by the capacitance coupling. This is referred to as self-boosting. Due to the boosted channel voltage, a voltage difference between a gate voltage of the program inhibited cell MC1 and a channel voltage is lower than a voltage difference sufficient to cause F-N tunneling. The pass voltage Vpass is applied by Vpass generator 1152 illustrated in FIG. 2, for example.

At t3, a program voltage Vpgm is applied to the selected word line WL1. In the program cell MC1', channel electrons are injected into a memory layer by the F-N tunneling. Since the F-N tunneling is not generated at the program inhibited cell MC1, channel electrons are not injected to a memory layer. The program voltage Vpgm is applied by Vpgm generator 1151 illustrated in FIG. 2, for example. At t4, the program voltage Vpgm of the selected word line WL1 is discharged to ground voltage (e.g., 0V). At t5, the pass voltages Vpass of the unselected word lines WL2 to WL8 are discharged to ground voltage, and the power supply voltage Vdd of the selected string selection lines Sel. SSL is discharged to ground voltage. An operation of discharging a word line voltage to ground voltage after a program operation is referred to as a recovery operation.

After t5, when the respective voltages of the lines WL1 to WL8 and Sel. SSL are discharged to a ground voltage, the above-described program operation ends. When a program operation includes multiple program loops, a programming step of one program loop ends after t5.

At t6, a verify operation begins in order to verify whether memory cells programmed during the program operation are normally programmed. When a program operation includes multiple program loops, a verifying step of one program loop (corresponding to the preceding programming step) begins at t6. First, a read voltage Vread is applied to the selected string selection line Sel. SSL and (initially) to the unselected string selection line Unsel. SSL. For example, the read voltage Vread may be applied by the voltage generator 1150 illustrated in FIG. 2. Application of the read voltage is performed to turn on a corresponding cell string. The read voltage Vread is a voltage sufficient to turn a transistor on. A ground voltage (0V) is then applied to the unselected string selection line Unsel. SSL at about t7. Unlike a planar flash memory, a vertical NAND (VNAND) flash memory shares word lines and bit lines to select a string being a program/verification target.

Thus, in the verify operation, the interval between t6 and t7 is the time period during which string selection transistors of the unselected string selection lines Unsel. SSL are turned on, e.g., to remove boosting charges of the unselected cell strings. This interval is inevitably performed in the VNAND flash memory. Also at t6, a read voltage Vread (e.g., 5V) is applied to the unselected word lines WL2 to WL8. At t7, a read voltage (e.g., 0V or a voltage slightly higher than 0V) is applied to the selected word line WL1. However, a negative counter pulse (having a negative counter voltage) is first applied to the selected word line WL1 at t6 during an initial stage of the verify operation (e.g., during the interval between t6 and t7). In general, a separate time is required to apply the negative counter voltage between the program operation and the verify operation, so that program performance is decreased. Thus, the interval between t6 and t7, during which transistors of unselected string selection lines Unsel. SSL are turned on at an initial stage of the verify operation, is used as a counter pulse interval during which a negative counter voltage is applied to the selected word line WL1. Thus, it is possible to minimize a decrease in program performance due to use of the negative counter pulse.

The voltage level of the negative counter pulse applied to the selected word line WL1 between t6 and t7 may be variable, according to the program state of the memory cell MC1. Likewise, the duration of the interval between t6 and t7 is variable. For example, in the event that a memory cell having an upper state of an MLC distribution is verified, a negative counter voltage having a relatively higher absolute value is applied to the selected word line WL1, although a negative counter voltage having a relatively lower absolute value is applied to the selected word line WL1 during a relatively long duration of the interval between t6 to t7.

Figure 10A:
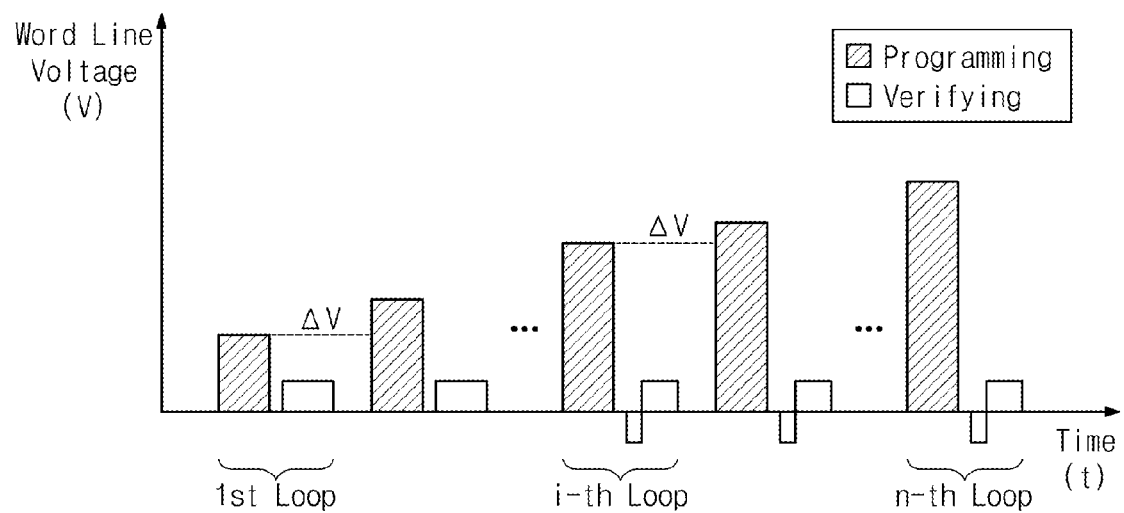
FIG. 10A is a timing diagram showing a program/verify operation of a flash memory device in a single level cell (SLC), according to another embodiment of the inventive concept.

FIG. 10A is a timing diagram showing a program/verify operation of a flash memory device in a single level cell (SLC), according to another embodiment of the inventive concept. The program operation depicted in FIG. 10A includes multiple program loops, each of which includes a programming step and a verifying step. That is, each program loop includes a step of programming selected memory cells (programming step) and a step of verifying programmed memory cells (verifying step), and the program loops are iterated to adjust a threshold voltage distribution. For ease of illustration, FIG. 10A does not show the voltage Vpass applied to a selected word line WL1 at an initial stage of the programming step of each program loop.

Referring to FIGS. 8 and 10A, during the programming step of a first program loop, a program voltage Vpgm is applied to the selected word line WL1. The program voltages Vpgm may be generated according to an Incremental Step Pulse Programming (ISPP) scheme, for example. When programming a multi-level cell, the program voltage Vpgm is generated according to the ISPP scheme to narrow threshold voltage distributions of programmed memory cells corresponding to each level. The program voltage Vpgm may have a start level of about 15V, for example, and may be stepwise increased by increments ΔV (e.g., 0.5V) according to the iterative program loops. Modifications or changes to variables, such as application frequency of the program voltage, voltage levels, and voltage application times of the program voltage used in each program loop, may be made by an external device (e.g., memory controller 1200 in FIG. 1) or by an internal device (e.g., control logic 1160 in FIG. 1).

Assuming that program loops, including corresponding programming steps and verifying steps, are executed n times, a negative counter voltage is applied during each verifying step according to a predetermined frequency less than n (corresponding to the total number of verifying steps). The predetermined frequency of applying the negative counter voltage is optimized in consideration of an electron rearrangement level of a memory layer (refer to FIG. 6) trapping electrons, a voltage level of the negative counter voltage applied to the selected word line WL1, a duration of applying the negative counter voltage, etc., and may be determined during fabrication. For example, the predetermined frequency of applying the negative counter voltage may be half of the total number of verifying steps. Thus, for example, in the case depicted in FIG. 10A, the negative counter voltage is not applied during the first to (i−1)th program loops, and is applied during an initial stage of the verifying step of each of the subsequent ith to nth program loops. Likewise, the duration of the negative counter voltage may be variable, as mentioned above. Also, the voltage level of the negative counter voltage and the duration thereof are variable for every program loop.

Figure 10B:
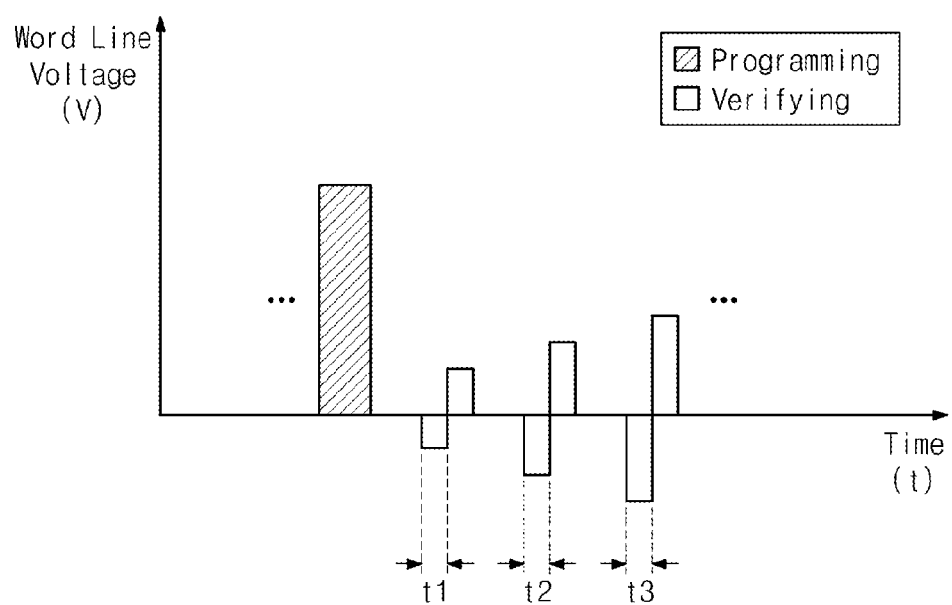
FIG. 10B is a timing diagram showing specifically an "i-th step" illustrated in FIG. 10A in a program/verify operation of a multi level cell (MLC), according to another embodiment of the inventive concept.

FIG. 10B is a timing diagram showing specifically an "i-th loop" illustrated in FIG. 10A for a multi level cell (MLC) verify operation, according to another embodiment of the inventive concept. In an MLC verify operation, the voltage level of the negative counter voltage applied to the selected word line WL1 is variable according to a program state of a memory cell MC1. Corresponding durations (t1, t2, and t3) of applying the variable voltage levels of the negative counter voltage may also be variable.

Figure 11:
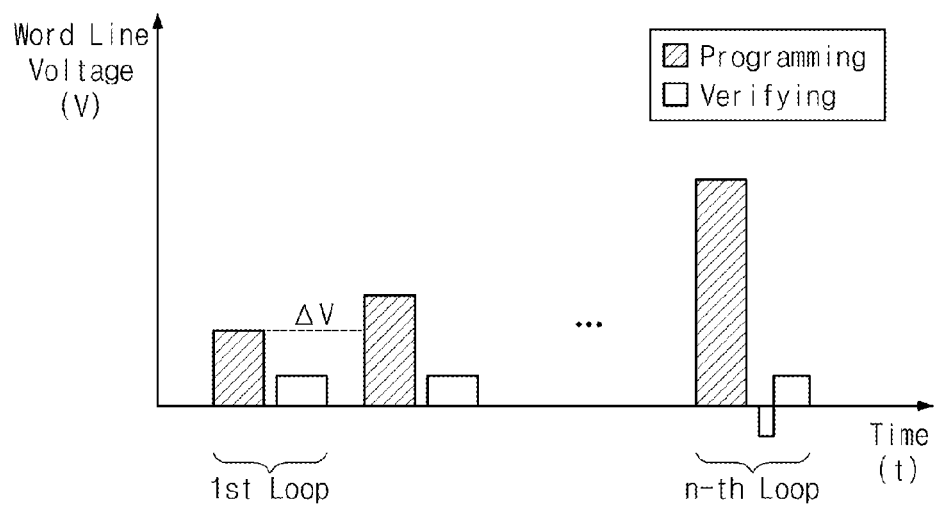
FIG. 11 is a timing diagram showing program/verify operation of a flash memory device, according to still another embodiment of the inventive concept.

FIG. 11 is a timing diagram showing a program/verify operation of a flash memory device in a single level cell (SLC), according to still another embodiment of the inventive concept. Assuming that program loops including programming steps and verifying steps are executed n times, a negative counter voltage is not applied to the selected word line WL1 until the verifying step of the last (n-th) program loop, that is, after a particular program state is passed (All Pass) when all previous program loops are executed. In other words, the negative counter voltage is applied after execution of a number of program loops that exceeds a predetermined reference number (n−1). Afterwards, the negative counter voltage is applied to the selected word line WL1 at an initial stage of a verifying step of an nth program loop. Duration of the negative counter voltage is variable. In an MLC verify operation, the voltage level of the negative counter voltage applied to the selected word line WL1 is variable according to a program state of a memory cell MC1, and durations (t1, t2, and t3) of applying the negative counter voltage are also variable (e.g., referring to FIG. 10B).

Figure 12:
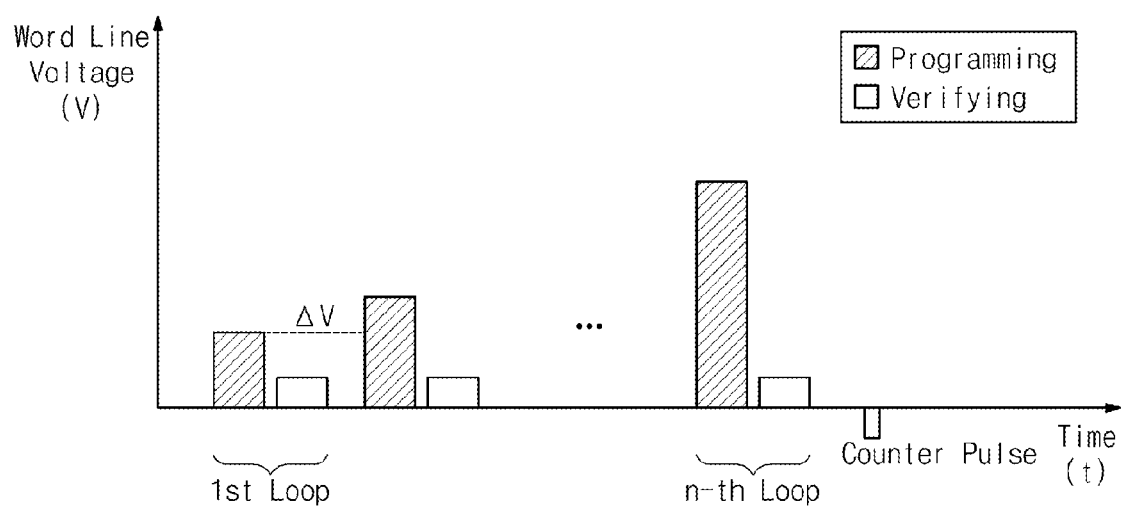
FIG. 12 is a timing diagram showing program/verify operation of a flash memory device, according to yet another embodiment of the inventive concept.

FIG. 12 is a timing diagram showing a program/verify operation of a flash memory device, according to yet another embodiment of the inventive concept. Assuming that program loops including programming steps and verifying steps are executed n times, a negative counter voltage is not applied to the selected word line WL1 until after the nth program loop where a particular program state is passed (All Pass). In other words, the negative counter voltage is applied to the selected word line WL1 after execution of a number of program loops that exceeds a predetermined reference number (n), which is the total number of program loops. The voltage level of the negative counter voltage applied to the selected word line WL1 is variable according to a program state of a memory cell MC1, and duration of the negative counter voltage is also variable.

Referring again to FIGS. 7 and 9, threshold voltages of memory cells are varied (e.g., are decreased) when a long period of time elapses, e.g., due to hot temperature stress (HTS), or due to degradation of an insulation layer according to increases in P/E cycles or endurance cycles. Information associated with variations in threshold voltage according to P/E cycles or endurance cycles is stored in a flash memory device during fabrication by the vendor. At this time, a voltage level of a negative counter voltage and/or duration thereof is varied in consideration of the number of P/E cycles or endurance cycles. For example, when a threshold voltage decreases in response to an increase in the number of P/E cycles, a relatively lower program voltage is required. Thus, the absolute value of the negative counter voltage applied to a selected word line is decreased and the duration of applying the negative counter voltage is shortened. Under other circumstances, the absolute value of the negative counter voltage is increased while the duration of applying the negative counter voltage becomes shorter, or the absolute value of negative counter voltage is decreased while the duration of applying the negative counter voltage is becomes longer.

Referring to FIGS. 10A to 12, threshold voltages of memory cells are varied (or, are decreased) over a long period time, e.g., due to hot temperature stress (HTS) and/or due to degradation of an insulation layer according to an increase in P/E cycles. At this time, a starting voltage level of the program voltage Vpgm applied according to the ISPP scheme is decreased (e.g., lower than 15V) and the increment ΔV of the program voltage Vpgm is increased (e.g., 0V to 1.5V). In addition, the absolute value of a negative counter voltage applied to a selected word line at an initial stage of a verifying step and a duration thereof are variable. For example, the absolute value of the negative counter voltage may be decreased and/or the duration of applying the negative counter voltage may be shortened. In some cases, the absolute value of the negative counter voltage is increased while the duration of the negative counter voltage becomes shorter, or the absolute value of negative counter voltage is decreased while duration of the negative counter voltage becomes longer.

A data storage device according to embodiments of the inventive concept may be applied to various products. The data storage device according to embodiments of the inventive concept may be implemented by electronic devices, such as a personal computer, a digital camera, a camcorder, a cellular phone, an MP3 player, a PMP, a PSP, a PDA, and the like, as well as storage devices such as a memory card, an USB memory, a solid state drive (hereinafter, referred to as SSD), and the like.

Figure 13:
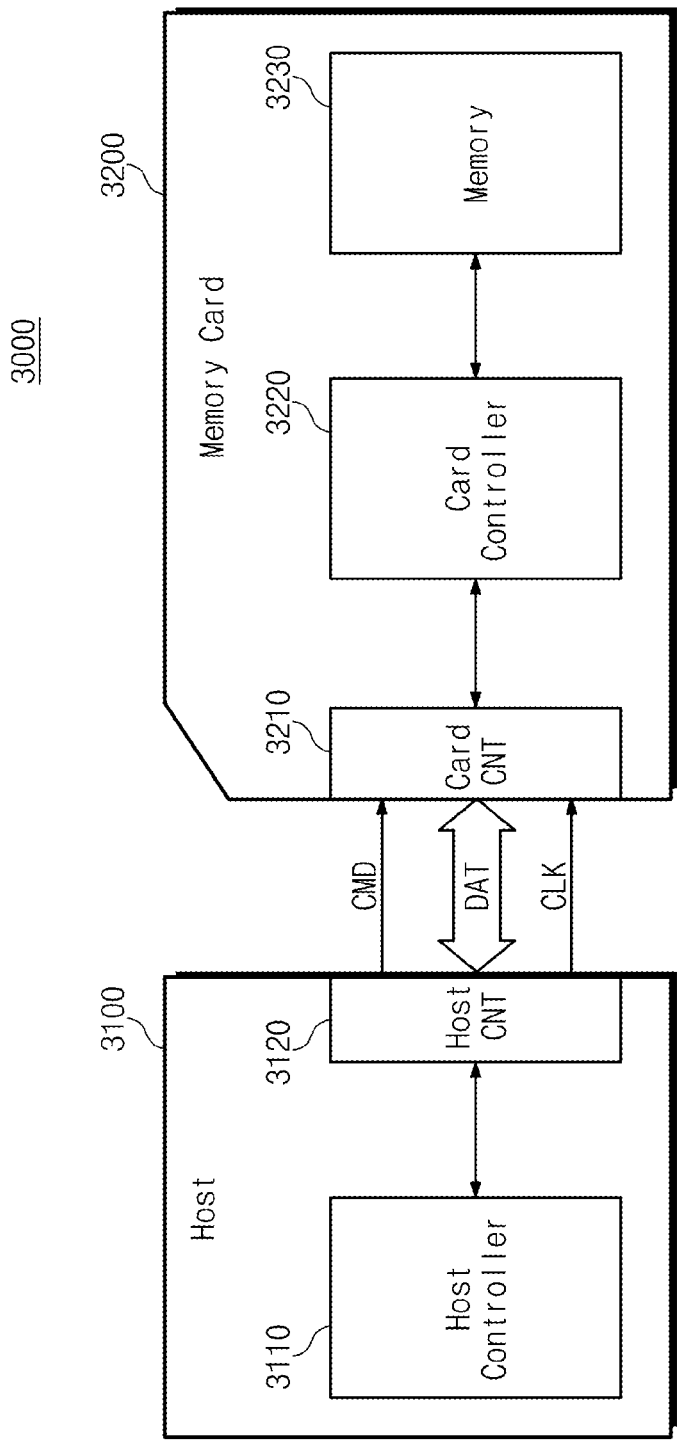
FIG. 13 is a block diagram schematically illustrating a memory card to which a data storage device, according to an embodiment of the inventive concept is applied.

FIG. 13 is a block diagram schematically illustrating a memory card to which a data storage device according to an embodiment of the inventive concept is applied. A memory card system 3000 includes a host 3100 and a memory card 3200. The host 3100 includes a host controller 3110 and a host connection unit 3120. The memory card 3200 includes a card connection unit 3210, a card controller 3220, and a flash memory 3230. For purposes of illustration, it may be assumed that the flash memory 3230 is implemented as a three-dimensional flash memory, described above.

The host 3100 writes data to the memory card 3200 and reads data from the memory card 3200. The host controller 3110 sends a command (e.g., a write command), a clock signal CLK, which is generated from a clock generator (not shown) in the host 3100, and data to the memory card 3200 via the host connection unit 3120.

The card controller 3220 stores data in the flash memory 3230 in response to a command input via the card connection unit 3210. The data may be stored in synchronization with a clock signal generated from a clock generator (not shown) in the card controller 3220. The flash memory 3230 stores data transferred from the host 3100. For example, when the host 3100 is a digital camera, for example, the memory card 3200 may store image data.

Figure 14:
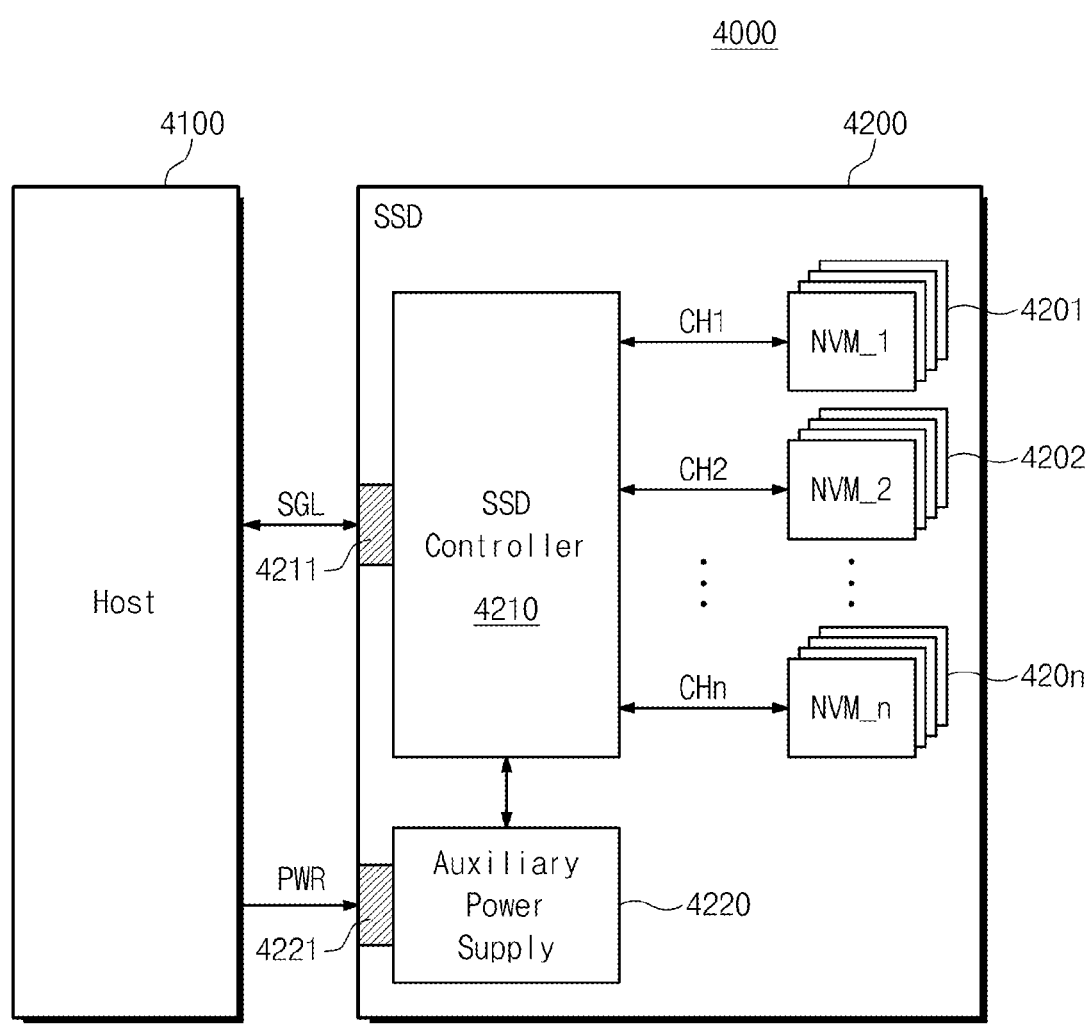
FIG. 14 is a block diagram illustrating a solid state drive to which a data storage device, according to an embodiment of the inventive concept is applied.

FIG. 14 is a block diagram illustrating a solid state drive to which a data storage device according an embodiment of the inventive concept is applied. Referring to FIG. 14, a solid state drive (SSD) system 4000 includes a host 4100 and an SSD 4200.

The SSD 4200 exchanges signals SGL with the host 4100 via a host interface 4211, and is supplied with power PWR via a power connector 4221. The SSD 4200 includes a plurality of nonvolatile memories 4201 to 420n, an SSD controller 4210, and an auxiliary power supply 4220.

The plurality of nonvolatile memories 4201 to 420n may be used as storage media of the SSD 4200. The SSD 4200 may use not only flash memory, but also nonvolatile memory devices such as PRAM, MRAM, ReRAM, FRAM, and the like. The plurality of nonvolatile memories 4201 to 420n are connected to the SSD controller 4210 via a plurality of channels CH1 to CHn. One channel may be connected to one or more nonvolatile memories 4201 to 420n. Nonvolatile memories 4201 to 420n connected to one channel may be connected to the same data bus.

The SSD controller 4210 exchanges signals SGL with the host 4100 via the host interface 4211. Herein, the signals SGL may include commands, addresses and data, for example. The SSD controller 4210 is configured to write data to or read out data from a corresponding nonvolatile memory according to a command from the host 4100. The SSD controller 4210 will be more fully described with reference to FIG. 15.

The auxiliary power supply 4220 is connected to the host 4100 via the power connector 4221. The auxiliary power supply 4220 is charged by power PWR from the host 4100. The auxiliary power supply 4220 may be placed inside or outside the SSD 4200. For example, the auxiliary power supply 4220 may be on a main board to supply auxiliary power to the SSD 4200.

Figure 15:
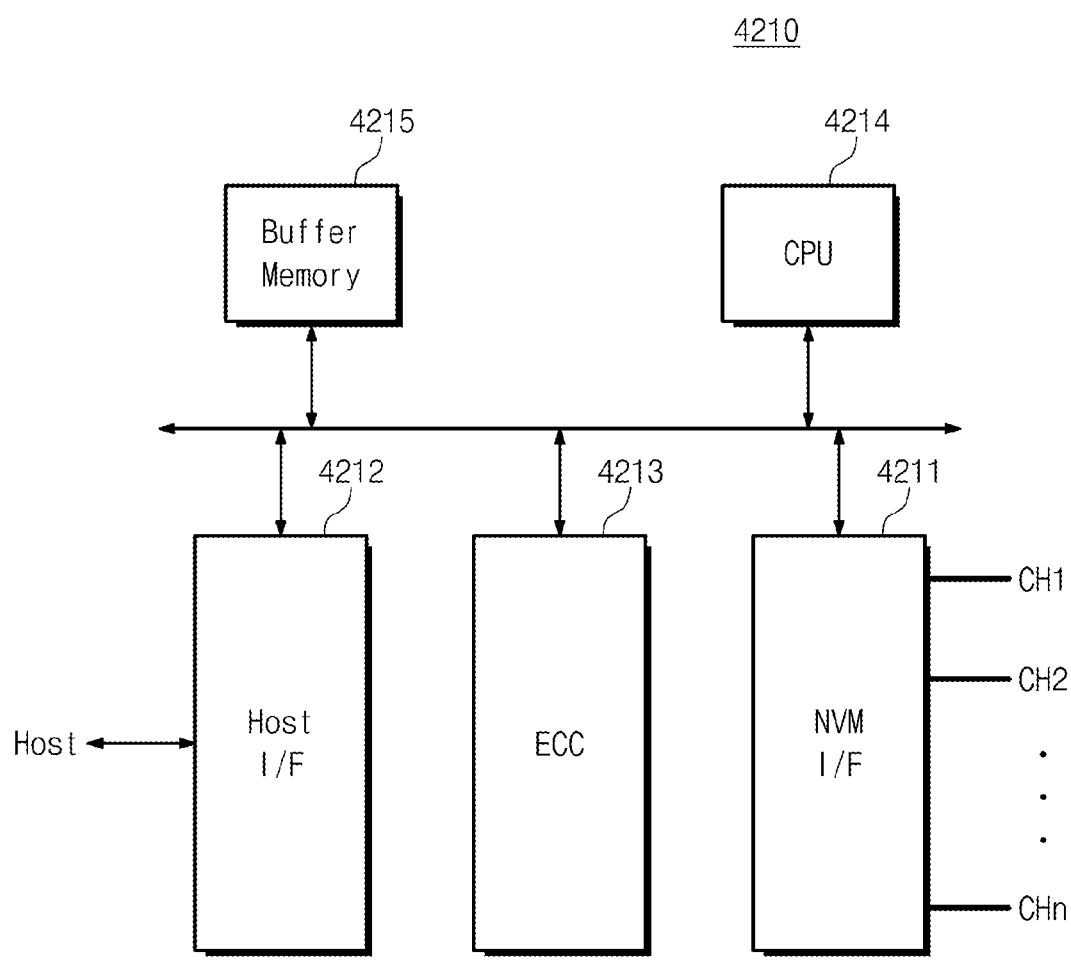
FIG. 15 is a block diagram schematically illustrating an SSD controller 4210 shown in FIG. 14.

FIG. 15 is a block diagram schematically illustrating an SSD controller 4210 shown in FIG. 14, according to an embodiment of the inventive concept. Referring to FIG. 15, an SSD controller 4210 includes a non-volatile memory (NVM) interface 4211, a host interface 4212, an ECC circuit 4213, a control processing unit 4214, and a buffer memory 4215.

The NVM interface 4211 may scatter data transferred from the buffer memory 4215 to channels CH1 to CHn. The NVM interface 4211 sends data read from nonvolatile memories 4201 to 420n to the host 4100 via the host interface 4212. Here, the NVM interface 4211 uses a flash memory interface technique, for example. That is, the SSD controller 4210 performs program, read and erase operations according to the flash memory interface technique.

The host interface 4212 provides an interface with an SSD 4200 according to the protocol of the host 4100. The host interface 4212 may communicate with the host 4100 using USB, SCSI, PCIe, ATA, PATA, SATA, Serial Attached SCSI (SAS), or the like. The host interface 4212 may also perform a disk emulation function which enables the host 4100 to recognize the SSD 4200 as a hard disk drive (HDD).

The ECC circuit 4213 generates error correction codes using data transferred to the flash memories 4201 to 420n. The error correction codes may be stored in spare areas of the flash memories 4201 to 420n. The ECC circuit 4213 detects errors of data read from the flash memories 4201 to 420n. When the detected error is correctable, the ECC circuit 4213 corrects the detected error.

The central processing unit (CPU) 4214 analyzes and processes signals SGL input from a host 4100 (refer to FIG. 14). The central processing unit 4214 controls the host 4100 through the host interface 4212 and the flash memories 4201 to 420n through the NVM interface 4211. The central processing unit 4214 controls the flash memories 4201 to 420n according to firmware for driving the SSD 4200.

The buffer memory 4215 temporarily stores write data provided by the host 4100 or data read from a flash memory. The buffer memory 4215 stores metadata to be stored in the flash memories 4201 to 420n or cache data. In response to a sudden power-off, metadata or cache data stored in the buffer memory 4215 is stored in the flash memories 4201 to 420n. The buffer memory 4215 may include DRAM, SRAM, or the like.

Figure 16:
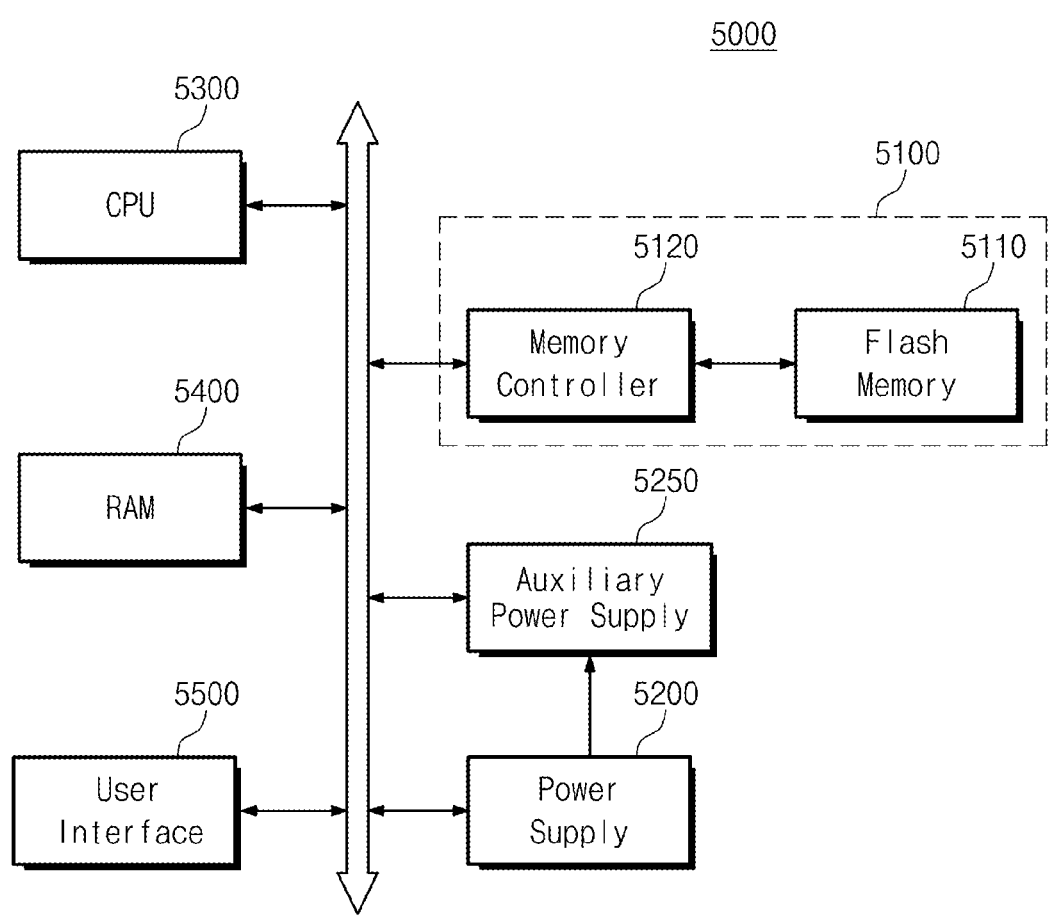
FIG. 16 is a block diagram schematically illustrating an electronic device implemented using a data storage device, according to an embodiment of the inventive concept.

FIG. 16 is a block diagram schematically illustrating an electronic device implemented using a data storage device, according to an embodiment of the inventive concept. Herein, an electronic device 5000 may be a personal computer or a handheld electronic device such as a notebook computer, a cellular phone, a PDA, a camera, or the like.

Referring to FIG. 16, the electronic device 5000 includes a memory system 5100, a power supply device 5200, an auxiliary power supply 5250, a CPU 5300, RAM 5400, and a user interface 5500. The memory system 5100 includes a flash memory 5110 and a memory controller 5120, as discussed above.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of programming a three-dimensional nonvolatile memory device, the method comprising:

executing at least one program loop including a programming step for programming selected memory cells of a selected string turned on by a selected string selection transistor and a verifying step for verifying whether the programming of the selected memory cells has passed; and wherein during at least part of the verifying step during which string selection transistors of unselected strings, connected to the same bit line with the selected string, are turned on, applying a negative counter voltage to a selected word line connected to the selected memory cell at least once, and wherein a level of the negative counter voltage is varied according to a multi-level program state.

2. A method of programming a three-dimensional nonvolatile memory device, the method comprising:

executing at least one program loop including a programming step for programming selected memory cells of a selected string turned on by a selected string selection transistor and a verifying step for verifying whether the programming of the selected memory cells has passed; and wherein during at least part of the verifying step during which string selection transistors of unselected strings, connected to the same bit line with the selected string, are turned on, applying a negative counter voltage to a selected word line connected to the selected memory cell at least once, and wherein a duration of the negative counter voltage is varied according to a multi-level program state.

3. A nonvolatile memory device comprising:

a memory cell array having memory cells arranged at intersections of word lines and bit lines and stacked in a direction perpendicular to a substrate;

a row selection circuit configured to drive selected word lines selected from among the word lines;

a page buffer circuit comprising a plurality of page buffers corresponding to the bit lines, the page buffer circuit being configured to temporarily store data to be programmed in the memory cell array or data read out from the memory cell array; and a voltage generator configured to generate a verification voltage during a verify operation, the verification voltage being used to verify whether programming of a selected memory cell of a selected string turned on by a selected string selection transistor is passed, and wherein during at least part of the verifying operation during which string selection transistors of unselected strings, connected to the same bit line with the selected string, are turned on, the voltage generator is further configured to generate a negative counter voltage applied to a selected word line connected to the selected memory cell at least once, wherein a level of the negative counter voltage is varied according to a multi-level program state, and wherein a duration of the negative counter voltage is varied according to a multi-level program state.

4. The nonvolatile memory device of claim 3, further comprising:

control logic configured to control generation of the negative counter voltage.

5. The nonvolatile memory device of claim 4, wherein the voltage generator is further configured to generate a program voltage during a program operation preceding the verify operation, the program voltage being used to program the selected memory cell of the selected string.

* * * * *